INVENTOR
R. J. KIRCHER
BY
N. S. Ewing
ATTORNEY

INVENTOR
R. J. KIRCHER
BY N. S. Ewing
ATTORNEY

Aug. 11, 1959 R. J. KIRCHER 2,899,569

DIODE CIRCUITS

Filed June 30, 1953 5 Sheets-Sheet 3

INVENTOR
R. J. KIRCHER
BY N. S. Ewing
ATTORNEY

INVENTOR
R. J. KIRCHER
BY N. D. Ewing
ATTORNEY

INVENTOR
R. J. KIRCHER

BY N. D. Ewing

ATTORNEY

United States Patent Office 2,899,569

Patented Aug. 11, 1959

2,899,569

DIODE CIRCUITS

Reymond J. Kircher, Summit, N.J., assignor to Bell Telephone Laboratories, Incorporated, New York, N.Y., a corporation of New York Application June 30, 1953, Serial No. 365,081

7 Claims. (Cl. 307—88.5)

This invention relates to electrical circuits employing p-n junction semiconductor translating devices having reverse conduction characteristics which include both a region of high resistance (low conductance) and a well-defined region of substantially constant voltage (with a relatively high conductance property).

Semiconductor devices of a type which may be employed in the practice of the present invention are described in an application of W. Shockley, Serial No. 211,212, filed February 16, 1951, which issued as Patent 2,714,702 on August 2, 1955, and also in an article by G. L. Pearson and B. Sawyer entitled "Silicon P–N Junction Alloy Diodes" which appears in the Proceedings of the I.R.E. for November 1952 at page 1348. These devices comprise an integral body of semiconductor material having two regions of opposite conductivity type material separated by a narrow zone of transition from material of one type conductivity to material of the opposite type conductivity. An electrode makes electrical connection to each of the two regions.

It has long been known that two-terminal semi-conductor devices of this type have asymmetrically conducting properties, i.e., they have rectifying properties, and from the characteristic designation of conductivity type applied to semiconductors, p-type and n-type, and from the fact that these characteristic properties are believed to be due to the junction between the p- and n-type materials, they have come to be known as p-n junction diodes or rectifiers. Generally speaking, easy flow, or forward conduction, is possible through the junction from one conductivity type to the other for a given potential difference between the conductivity types, and hard flow, or reverse conduction, for the opposite potential between the conductivity types.

Among the materials more commonly used for such devices are germanium and, more recently, silicon. In the case of germanium, the useful properties of the devices to be described should not be confused with the negative reistance displayed by point-contact germanium diodes when driven sufficiently far in the reverse direction. This negative resistance arises from temperature effects, which, it is thought, is not the case with the reverse constant voltage characteristic to be described.

The above-cited Shockley patent describes a new property of p-n junction devices previously unrealized and also suggests novel circuits utilizing this new property. This property, briefly, is a region of substantially constant voltage below burnout and over a wide range of currents in the reverse conduction characteristic. Important features of this property are that the break in the reverse conduction characteristic from a very high resistance to a low alternating-current resistance at nearly constant voltage is very sharp, and that the critical reverse voltage at which the characteristic breaks is very stable both with life and with temperature variations. Further, this critical voltage at the "knee" of the characteristic may be predicted and by proper design may be obtained at any desired voltage over a range from a few volts to as high as a thousand volts. One way of designing for a particular critical voltage is by controlling the concentration gradient in the transition zone, for example, by controlling either the width of the transition zone or by controlling the inherent conductivity of the semiconductor material employed, as by controlling the amount of impurity added to the material. Prior to the discovery and realization by Shockley of this constant voltage region in the reverse conduction characteristic, the critical voltage was so high, probably a thousand volts or more, that devices driven this far in the reverse condition would be limited by the above-mentioned thermal effects and probably burn out. Now, however, units with low critical reverse voltages may be designed, giving them wide application where such a property is useful.

It has been suggested that the abrupt change from a high resistance reverse characteristic to a low resistance substantially constant voltage characteristic is due to effects similar to those described by Zener (145 Proc. of Royal Society 523, London, 1934) for the breakdown of insulators. These devices are therefore known by some as "Zener diodes," and the critical reverse voltage is referred to as the "Zener voltage." According to another theory, the bonds which tightly hold the electrons within their crystalline structure are broken at a critical voltage gradient, releasing an avalanche of electrons to serve as current carriers. An exact or complete understanding of the theory explaining the novel properties discovered by Shockley is, however, not necessary to an understanding of the present invention.

Four terminal networks illustrating principles of the invention are described in detail below. Each of these networks includes two asymmetrically conducting impedance devices, one of which comprises a p-n junction semiconductor device of the type described above. An external connection is made to the junction of these two devices which are oppositely poled for forward currents with respect to the junction. One pair of terminals is connected in circuit with one only of the two devices and the other pair of terminals is connected in circuit with both of the asymmetric devices. Voltages applied to the networks are such that the p-n junction devices, operating on a large signal basis, will at times be driven into their constant voltage region characterized by very low incremental impedance.

These circuits illustrate new degrees of transmission and terminal impedance control which become available by the use of these novel combinations. In some cases, further asymmetrical devices are connected either in series or in shunt with the input or output terminals to obtain desired characteristics.

A feature of the invention is that these unique characteristics are obtained without the use of direct-current biases and with only passive elements.

Other circuits employing p-n junction devices in combination with oppositely poled asymmetrically conducting impedance elements are described in my application Serial No. 365,080, filed herewith, which issued as Patent 2,854,651 on September 30, 1958.

A more complete understanding of the invention including its objects and features may be obtained by a consideration of the following detailed description when read in accordance with the attached drawings, in which.

Figure 4:
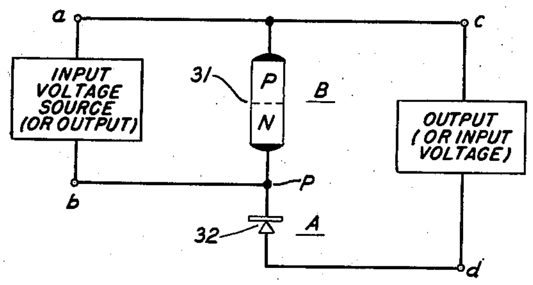
Figure 5:
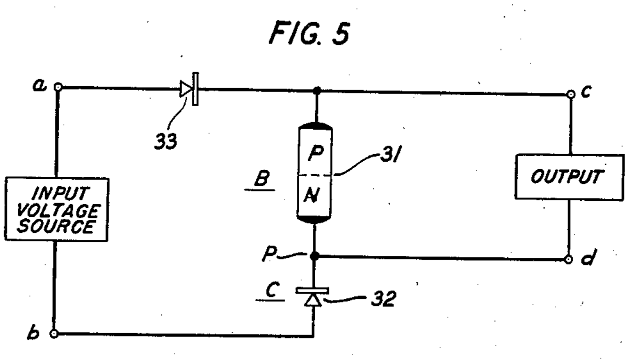
Figure 5A:
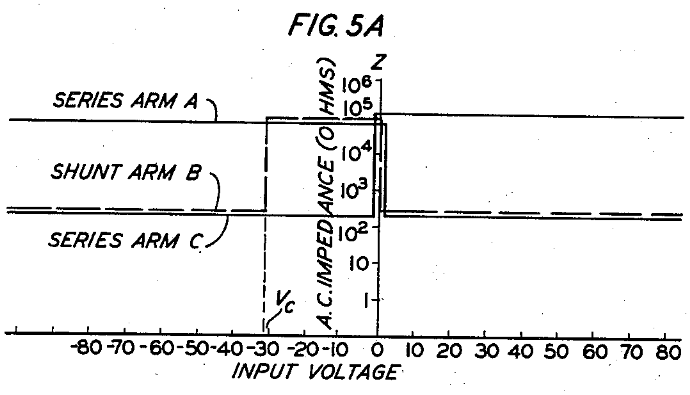
Figure 5B:
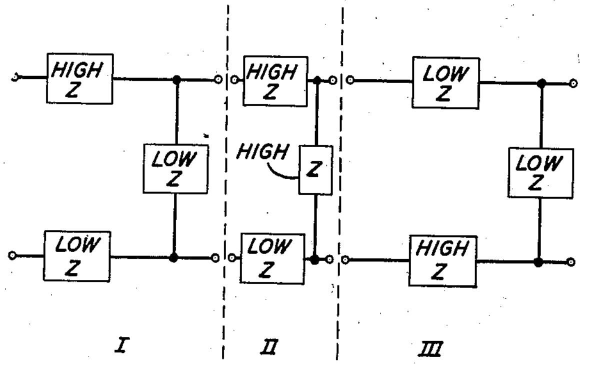
Figure 6:
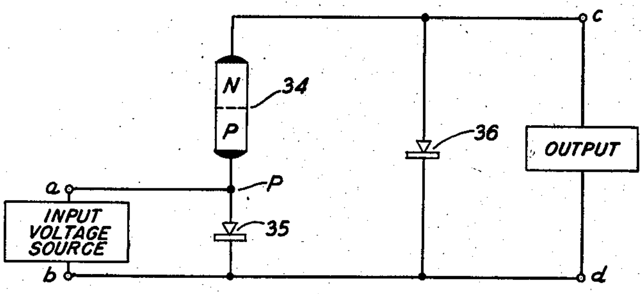
Figure 7:
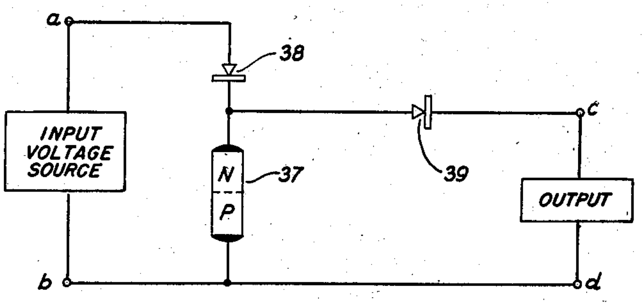
Figure 8:
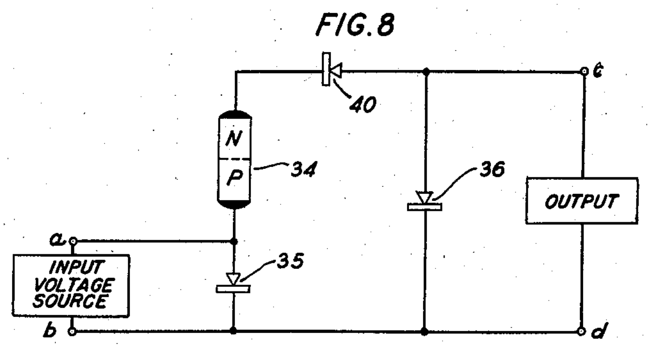

Figs. 3A, 3B, 4A, and 4B are impedance diagrams descriptive of the characteristics of these circuits;

Fig. 5 is a schematic diagram illustrating an extension of the basic circuit shown in Fig. 4 to obtain desired characteristics;

Figs. 5A and 5B are impedance diagrams descriptive of the circuit of Fig. 5; and Figs. 6, 7, and 8 illustrate further extensions of the basic circuits.

Figure 1:
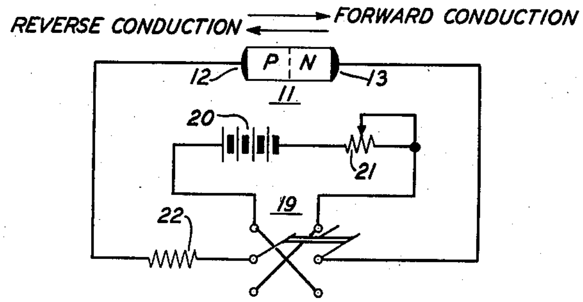
Fig. 1 represents a generalized p-n junction semiconductor device of a type described in the Shockley application mentioned above connected in a circuit for obtaining its conduction characteristic.

The semiconductor device 11 in Fig. 1 has a p-n junction formed by an integral body of semiconductor material including body sections of p- and n-type conductivity type material, respectively. There is a thin zone at the interface of the p- and n-type body portions over which there is a progressive change or transition from the degree and type of conductivity characteristic of one body portion to the degree and type of conductivity characteristic of the other body portion. Electrodes 12 and 13 make electrical ohmic connection to the p- and n-type body portions.

The symbol employed in Fig. 1 to represent a p-n junction device is not intended to accurately represent physical structure but is merely a generalized representation illustrating generic features of such devices. Such a device may be obtained by drawing and doping the semiconductor material.

Figure 1A:
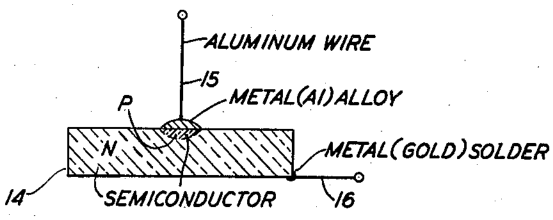
Fig. 1A illustrates a specific device of this type.

Fig. 1A shows in cross-section a representation of a second p-n junction device constructed by alloying principles but also having the desired characteristics in the reverse conduction condition. This second device comprises a homogeneous n-type silicon crystal 14 to which an aluminum electrode 15 is alloyed by heating the crystal and bringing it in contact with the aluminum. This type of device is described in more detail in an application of G. L. Pearson, Serial No. 270,370, filed February 7, 1952, which issued as Patent 2,757,324 on July 31, 1956, and also in the Pearson-Sawyer article cited above. It is believed that a p-n junction having the general configuration illustrated in the figure is grown by deposition during the cooling cycle and is situated at the innerface between the unmelted silicon and the frozen-out primary solid solution. A second metallic electrode 16, which may be gold, may be arranged to make ohmic contact with the opposite face of the crystal 14. The symbol employed in Fig. 1 is used in the remaining figures to represent, generically, a device having the characteristics about to be described.

By means of the double-pole double-throw switch 19 in Fig. 1, voltages of either polarity may be applied to the p-n junction device from the battery 20. By means of the variable resistance 21, the magnitude of these voltages may be varied. The resistor 22 limits current flow through the device to a safe value.

Figure 2:
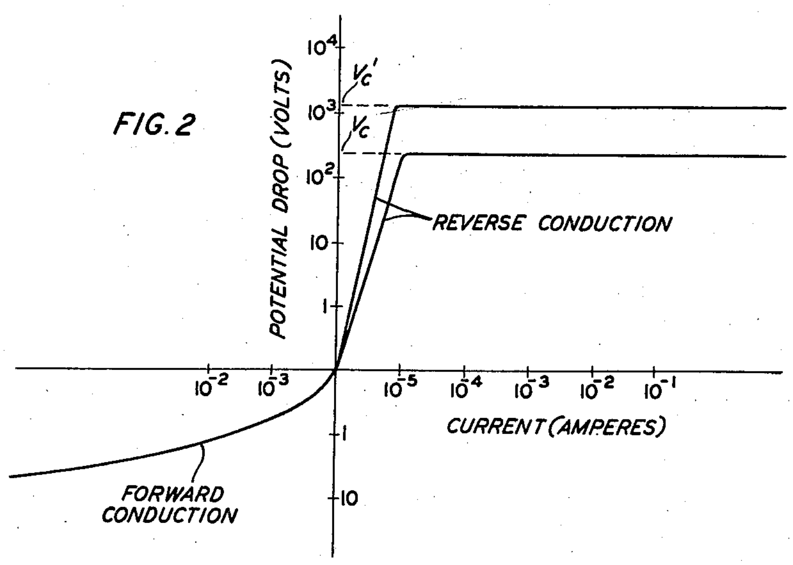
Fig. 2 illustrates conduction characteristics of several p-n junction devices obtainable by the circuit shown in Fig. 1.

Fig. 2 illustrates two typical characteristics of these devices, which may be obtained by the circuit shown in Fig. 1. Both currents and voltages are on a logarithmic scale to illustrate more clearly the saturation region in the reverse conduction characteristic. Over this region, which lies between zero volts and the knees of the curves, the characteristics are those of very high resistances. In fact, had a linear current scale been employed, this region would be reduced to a vertical line and obscured by the voltage ordinate. At the critical reverse voltages $V_c$ and $V_c'$, respectively, the characteristics break sharply from a very high resistance to a low alternating-current resistance, substantially constant voltage characteristic, which extends over an appreciable range of currents and includes several decades of current variation. Although the breaks at the reverse voltages $V_c$ and $V_c'$ appear quite sharp on the scale used, it should again be noted that had a linear current scale been employed, the sharpness of these breaks would be even more striking.

The present invention utilizes the reverse characteristic just described. As mentioned above, by proper design of the p-n junction device and, more particularly, by proper control of the concentration gradient in the transition zone, a unit may be designed for any desired value of $V_c$ over a large range of values. It may be noted that the forward conduction characteristics are those of conventional p-n junction diodes and differ from each other in only a minor degree.

Figure 3:
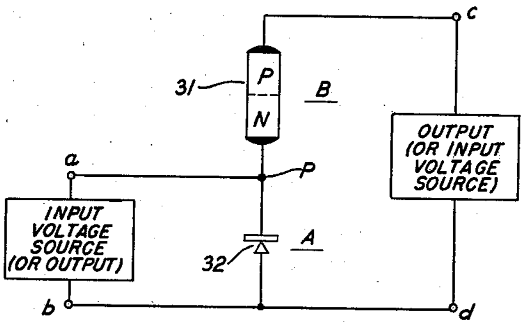
Figs. 3 and 4 illustrate basic four-terminal networks embodying principles of the invention.

A four-terminal network embodying principles of the invention is shown in Fig. 3. This network includes two asymmetrically conducting impedance elements, a p-n junction semiconductor device 31 having the unique reverse conduction characteristic illustrated in Fig. 2, and a high back resistance diode 32. The latter device may, for example, be a vacuum tube diode, a crystal rectifier, or may also be a p-n junction semiconductor device. The two asymmetrical devices are connected together and oppositely poled for forward currents with respect to their junction *p*. An external connection is made to this junction. The remaining external connections are made as indicated such that terminals *a*—*b* are connected in circuit with one only of the asymmetrical devices, diode 32, while terminals *c*—*d* are connected across both devices 31 and 32.

Terminals *a*, *b* may be used as input terminals and *c*, *d* as output terminals, or vice versa. If input is applied to terminals *c*, *d*, the circuit acts as a non-linear voltage divider. Terminals *a*—*b* may instead be connected to include only the p-n junction device 31 instead of the diode 32, as illustrated in Fig. 4. This will result in marked changes in transmission and impedance characteristics, as will be described. As another modification, the polarities of both diodes in each circuit may be reversed.

Figure 3A:
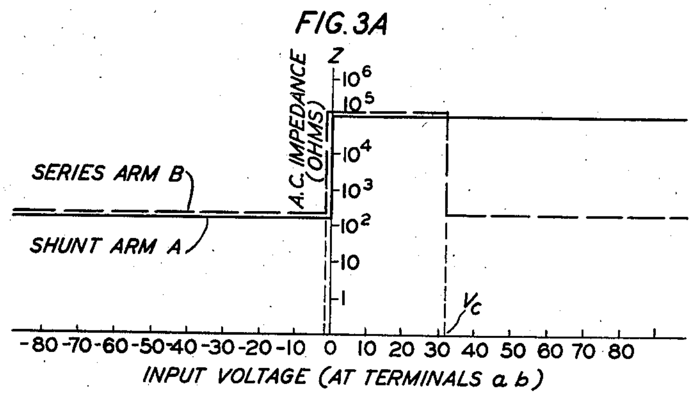
Figure 3B:
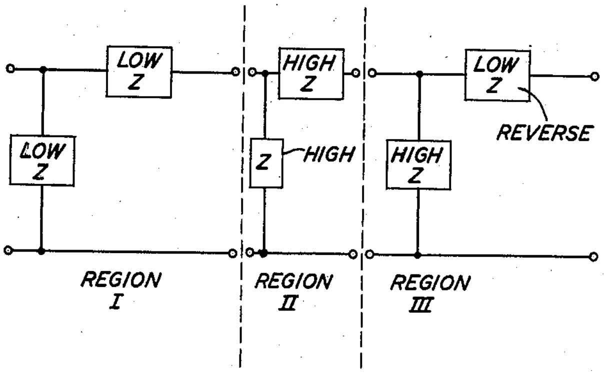
Figure 4A:
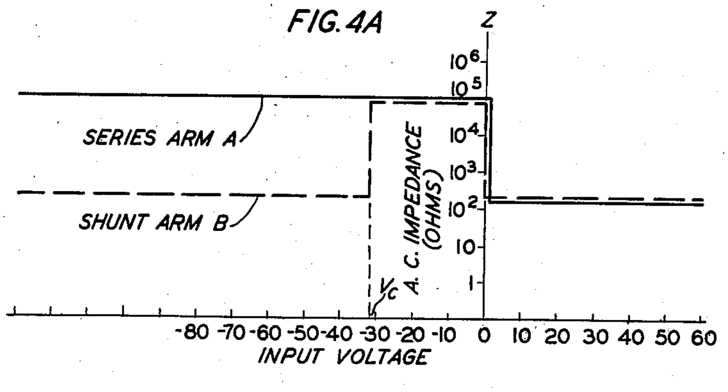
Figure 4B:
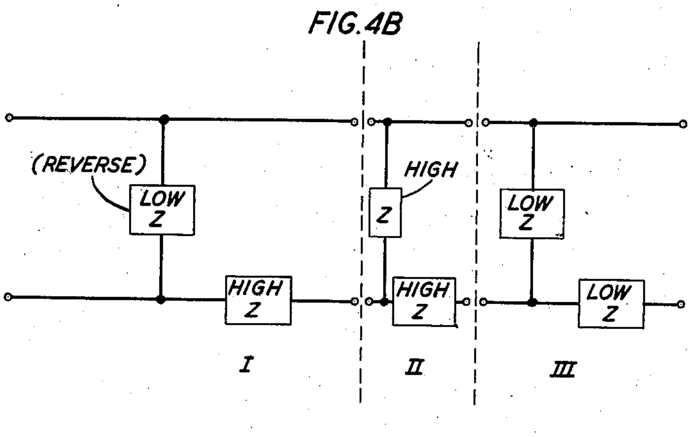

The impedance diagrams shown in Figs. 3A, 3B, 4A, and 4B are useful in illustrating the characteristics of these networks. In Figs. 3A and 4A, the impedances of the various arms are plotted on a logarithmic scale as a function of applied voltage. In both of these diagrams, voltage is applied across terminals *a*, *b* with positive and negative referring to the potential of terminal *a* with respect to terminal *b*. Pictorial representations of the effective impedance contributed by each arm in each of the voltage ranges of interest are shown in Figs. 3B and 4B.

In the circuits of both Figs. 3 and 4, the arm A has the characteristic of a conventional high back resistance diode, breaking sharply from a low to a high impedance near zero applied volts. Due to the different locations of the input terminals in these two circuits, however, arm A in Fig. 3 is a low impedance for negative voltages and a high impedance for positive voltages, while the converse is true in Fig. 4. The p-n junction devices in both circuits exhibit two regions of low impedance and an intermediate region of high impedance. In the circuit of Fig. 3, the low impedance of arm B is achieved as a result of driving the p-n junction device 31 beyond its critical reverse voltage $V_c$ and occurs in response to positive voltages, while the corresponding effect occurs with the circuit of Fig. 4 in response to negative voltages.

The effect of these networks on through transmission (from terminals *a*—*b* to terminals *c*—*d*) can be seen by referring to the diagrams of Figs. 3B and 4B. The impedances of the various arms are conveniently referred to merely as "high" or "low" since the asymmetrical devices will either have impedances on the order of hundreds of thousands of ohms or merely hundreds of ohms. The low series impedance in Region III of Fig. 3B and the low shunt impedance in Region I of Fig. 4B arise from driving the p-n junction devices sufficiently far in their reverse direction to utilize the constant voltage region in their reverse characteristics. This fact is indicated on the drawing by denoting these impedances as low "reverse" impedances.

Although direct transmission will depend on source and load impedance terminations, certain generalities can be noted. Most evident of these in Fig. 3B is that transmission will be markedly better in Region III than in either of the other two regions and more particularly if the load impedance termination across terminals *c*, *d* is low. Also, input impedance will be high in both Regions II and III and will be low in Region I.

None of the regions in Fig. 4B permit easy transmission, although the unique combinations of shunt and series impedances may achieve desired impedance characteristics for particular applications.

In the circuit of Fig. 5, the input terminals *a*—*b* include both of the asymmetrical devices 31 and 32 and output terminals *c*—*d* include only the p-n junction semiconductor device 31. To modify the transmission impedance characteristics obtained by this combination alone, a third asymmetrically conducting impedance element 33 is connected in series with the input terminal *a*.

The impedance characteristics of the three arms of this network are illustrated in Figs. 5A and 5B. For negative input voltages less than the critical reverse voltage $V_c$ of the p-n junction device, both the diode 33 and the p-n junction device 31 are biased in their high resistance condition, while the diode 32 is biased in its forward easy conduction state. The voltage appearing across the output terminals *c*—*d* is, therefore, substantially proportional to the ratio of the high reverse resistance of the p-n junction device 31 to the sum of the reverse resistance of the diode 33 and the high reverse resistance of the p-n junction device 31. If the negative voltage across the p-n junction device should exceed its critical reverse voltage $V_c$, the voltage across this device will become substantially constant, and any further increase, in a negative sense, of the input voltage will appear across the diode 32. Since the alternating-current or incremental impedance of the p-n junction device is very low in the constant voltage region, a relatively low alternating-current impedance is produced across the output terminals *c*, *d* for the condition just described. This impedance changes to a very high value when the voltage across the p-n junction device is less than its critical reverse value (Region II).

Potential variations input terminals *a*, *b*, therefore, produce very sharp and very large alternating-current impedance variations across the output terminals *c*, *d*. When the input voltage is positive (Region III), both the diode 33 and the p-n junction device 31 are biased in the easy flow condition, and the diode 32 is in its high resistance reverse condition. A high impedance is thus maintained across the input terminals, while a low impedance is placed across the output terminals. Other features of interest may be seen upon further examination of the diagrams in Figs. 5A and 5B.

Fig. 6 illustrates another circuit utilizing the combination of a p-n junction semiconductor device 34 and a conventional diode 35 oppositely poled for forward currents with respect to a common connection *p*. The asymmetrical devices in Fig. 6 are poled oppositely to those in Fig. 5 and input terminal *a* is connected to the common connection *p*. This circuit is essentially a $\pi$-network and for negative input signals less than the critical reverse voltage of the p-n junction device, appreciable loss occurs in transmission through the network while a high impedance is maintained at input and output terminals by the shunt diodes 35 and 36. At a larger negative signal voltage, the magnitude being determined by the critical reverse voltage of the p-n junction device 34, the latter device will be driven into its constant voltage condition, thereby permitting transmission through the network with much less loss. This circuit may therefore be classified as a gate. On reversing the input signal polarity, the network attenuates the input signal and presents a low input shunt impedance since all devices will be biased in the easy flow condition by a positive input signal.

Fig. 7 illustrates another modification in the form of a T-network. Positive input signals less than the critical reverse voltage of the p-n junction device 37 will be transmitted with little loss through the series diodes 38 and 39. If this critical voltage is exceeded, the high conductivity of the p-n junction device in its constant voltage condition will effect a marked limiting or clipping of the input signal. In response to negative input signals, the network presents a high impedance to the signal source and high attenuation results since the series diodes 38 and 39 are in their high resistance reverse condition and the p-n junction device 37 is a low shunt impedance.

Fig. 8 is similar to Fig. 6 with the exception that a diode 40 has been interposed between the p-n junction device 34 and the output terminal *c*. This diode 40 modifies the transmission characteristic of the Fig. 6 circuit in that for all positive voltages, the network will comprise substantially a series resistance equal to the high reverse resistance of the diode 40 shunted by the low forward resistance of both the diodes 35 and 36. For positive voltages, the network, therefore, acts as a shorting switch for a load connected across the output terminals *c*, *d*. For negative voltages less than the critical reverse resistance of the p-n junction device 34, the series arm and the shunt arms will be high impedances. For negative voltages greater than the critical reverse voltage of the p-n junction device, the series arm will be a low impedance and, since the shunt arms remain high impedances, easy transmission from the terminals *a*, *b* to terminals *c*, *d* will be possible.

No attempt has been made to exhaust all possible uses of the combination of a p-n junction semiconductor device of the type described above and a conventional diode which are oppositely poled for forward currents with respect to a common junction to which an external connection is made. The circuits herein described have been selected merely to illustrate the possible degrees of transmission and impedance control obtainable with this combination in various types of networks. In many of the circuits described, for example, the poling of each of the diodes may be reversed to obtain similar characteristics for opposite polarities of applied voltages. Many other modifications and embodiments will be readily obvious to one skilled in the art so that the invention should not be deemed limited to the embodiments specifically described above.

In the circuits described above, the p-n units are assumed to be shielded from photoelectric effects. However, in certain instances, it may be desired to alter the transmission properties of such devices by appropriate optical means to make the unit responsive to photoelectric effects.

What is claimed is:

1. A four-terminal voltage dividing network comprising a first pair of terminals and a second pair of terminals, a two-terminal p-n junction semiconduction translating device having a low resistance forward conduction characteristic and a high resistance reverse conduction characteristic for reverse voltages less than a critical value and a substantially constant voltage reverse conduction characteristic for reverse voltages equal to or greater than said critical value, a two-terminal asymmetrically conducting impedance device having a low resistance forward conduction characteristic and a high resistance reverse conduction characteristic, means connecting said devices in opposition, for forward currents, with respect to a common connection, a first circuit including said first pair of terminals and one only of said devices, a second circuit including said second pair of terminals and both of said devices, and a source of voltage connected to one of said circuits for applying to said p-n junction device biasing voltages including reverse voltages at least as great as said critical value.

2. In combination, a source of voltage, a voltage dividing network comprising a pair of two-electrode asymmetrically conducting impedance elements connected together and oppositely poled for forward currents, one of said devices comprising a p-n junction semiconductor translating device having a high resistance reverse conduction characteristic for reverse voltages less than a critical value and a substantially constant voltage reverse conduction characteristic for reverse voltages equal to or greater than said critical value, means for connecting said voltage source across said pair of devices, and a load circuit connected across one only of said devices, said voltage source supplying reverse voltages at least intermittently greater than said critical value.

3. A four-terminal network having an input circuit and an output circuit, a shunt branch intermediate said input and output circuits including a first asymmetrically conducting impedance element, a second asymmetrically conducting impedance element connected in series with one of said circuits and oppositely poled, for forward currents, with respect to said first element, one of said first and second elements comprising a p-n junction device, and a third asymmetrically conducting impedance element also connected in series with one of said circuits.

4. The combination in accordance with claim 3 and means connected in one of said circuits for applying to said p-n junction device reverse voltages greater than the critical reverse voltage of said p-n junction device.

5. The combination in accordance with claim 3 and a fourth asymmetrically conducting impedance element connected in shunt relation with one of said circuits.

6. A four-terminal network having an input circuit and an output circuit, a shunt branch intermediate said input and output circuits including a first asymmetrically conducting impedance element, a second asymmetrically conducting impedance element connected in series with one of said circuits and oppositely poled, for forward currents, with respect to said first element, one of said first and second elements comprising a p-n junction device, and a third asymmetrically conducting impedance element connected in shunt relation with one of said circuits.

7. The combination in accordance with claim 6 and means connected in one of said circuits for applying to said p-n junction device reverse voltages greater than the critical reverse voltage of said p-n junction device.

References Cited in the file of this patent

UNITED STATES PATENTS

| | | |
|---|---|---|
| 1,863,674 | Thorpe | June 21, 1932 |
| 1,883,613 | Devol | Oct. 18, 1932 |
| 2,576,026 | Meacham | Nov. 20, 1951 |
| 2,579,336 | Rack | Dec. 18, 1951 |
| 2,612,567 | Stuetzer | Sept. 30, 1952 |
| 2,629,834 | Trent | Feb. 24, 1953 |
| 2,644,896 | Lo | July 7, 1953 |
| 2,655,609 | Shockley | Oct. 13, 1953 |
| 2,658,142 | St. John | Nov. 3, 1953 |
| 2,714,702 | Shockley | Aug. 2, 1955 |